United States Patent
Lee et al.

(10) Patent No.: US 9,082,496 B2
(45) Date of Patent: Jul. 14, 2015

(54) METHOD AND APPARATUS FOR ADAPTIVE TIMING WRITE CONTROL IN A MEMORY

(71) Applicant: Taiwan Semiconductor Manufacturing Co., Ltd., Hsin-Chu (TW)

(72) Inventors: PoHao Lee, Hsinchu (TW); Chung-Cheng Chou, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 150 days.

(21) Appl. No.: 13/761,545

(22) Filed: Feb. 7, 2013

(65) Prior Publication Data

US 2014/0219002 A1   Aug. 7, 2014

(51) Int. Cl.
  *G11C 11/00*   (2006.01)
  *G11C 11/16*   (2006.01)
  *G11C 13/00*   (2006.01)

(52) U.S. Cl.
  CPC ........ *G11C 11/1675* (2013.01); *G11C 13/0064* (2013.01); *G11C 13/0069* (2013.01); *G11C 13/0007* (2013.01); *G11C 2013/0054* (2013.01); *G11C 2013/0066* (2013.01); *G11C 2213/79* (2013.01)

(58) Field of Classification Search
  CPC ........... G11C 13/0004; G11C 13/0069; G11C 11/15; G11C 15/16
  USPC .......................................... 365/158, 148, 163
  See application file for complete search history.

(56) References Cited

U.S. PATENT DOCUMENTS

| 7,190,607 | B2 | 3/2007 | Cho et al. |
| 2011/0157966 | A1 | 6/2011 | Lee |
| 2013/0016554 | A1 | 1/2013 | Abedifard |
| 2013/0215669 | A1* | 8/2013 | Haukness ............... 365/148 |

FOREIGN PATENT DOCUMENTS

KR   10-2011-007569   7/2011

OTHER PUBLICATIONS

Official Action issued Jul. 13, 2014 in counterpart KR patent application No. 10-2013-0045312.
Qazi, M., "A 4kb Memory Array for MRAM Development", Submitted to the Dept. of Electrical Engineering and Computer Science at Massachusetts Institute of Technology, Feb. 2007, 131 pages.

* cited by examiner

*Primary Examiner* — Huan Hoang
(74) *Attorney, Agent, or Firm* — Duane Morris LLP

(57) ABSTRACT

A bit line, which is coupled to a resistive element of a memory cell is set to a first voltage level. The memory cell may be an MRAM cell or an RRAM cell. The resistive element is configured to have a first resistance in a first state of the memory cell and a second resistance in a second state of the memory cell. A source line, which is selectively coupled to the memory cell by an access transistor, is set to a second voltage level. A word line signal is asserted to apply a first bias voltage across the resistive element. The applied first bias voltage initiates a write operation at the memory cell. The word line signal is deasserted after a variable time duration based on a detection, during the write operation, of a current through the resistive element.

21 Claims, 9 Drawing Sheets

METHOD AND APPARATUS FOR ADAPTIVE TIMING WRITE CONTROL IN A MEMORY

BACKGROUND

In some types of memory technologies, data is stored by setting the state of a resistive element that may have varying resistance depending on the state. Examples of such memory technologies include magneto-resistive random access memory (MRAM) and resistive random access memory (RRAM or alternately called ReRAM). MRAM is a non-volatile random access memory technology that uses magnetic storage elements to store data. Spin-transfer torque MRAM stores data at memory cells having two superimposed layers of magnetic material separated by a thin insulating film, defining a magnetic tunnel junction ("MTJ" or "MTJ element") of an MRAM cell. The two layers include a magnetic layer that is permanently magnetized in a fixed magnetic field alignment direction (this layer is referred to as a pinned layer), and a changeably-magnetized magnetic layer (this layer is referred to as a free layer). The changeably-magnetized magnetic layer can be magnetized in one of two orientations relative to the permanently magnetized layer. The two orientations are characterized by distinctly different serial resistances through the superimposed layers of the MTJ. The magnetic field orientation of the changeable layer can be aligned the same as that of the permanent magnet layer (parallel), or the magnetic field of the changeable layer can be aligned directly opposite to that of the permanent magnet layer (anti-parallel). The parallel alignment state has a relatively lower resistance and the anti-parallel alignment state has a higher resistance. These two states as sensed from their relatively higher or lower resistances ($R_H$ and $R_L$) represent different binary logic values of bits in the memory.

For an MRAM write operation, a voltage $V_{MTJ}$ is applied, with one polarity or the reversed polarity, to the MTJ of an MRAM cell. Write lines referred to as a "bit line" and a "source line" may be used for providing $V_{MTJ}$ with either polarity. The bit line is coupled to the MTJ of each memory cell, and the source line is selectively coupled to each MTJ by a corresponding access transistor which may be turned on by a corresponding word line. If the MTJ of an MRAM cell is initially in the high resistance state, the low resistance state can be written by setting the bit line to a logical high voltage, setting the source line to a logical low voltage, and asserting a word line associated with the MRAM cell. Asserting the word line generates a bias voltage of a first polarity across the MTJ, and the MTJ changes over time to the parallel alignment (low resistance state). To write the low resistance state, the opposite voltage polarity is applied to the MTJ (e.g., the bit line is set low, and the source line is set high).

RRAM is another non-volatile memory type that uses a dielectric, which is normally insulating, and which can be made to conduct through a filament or conduction path formed after application of a suitable voltage. Once the conduction path is formed, it may be broken (resulting in a relatively high resistance) or re-formed (resulting in a relatively low resistance) by an appropriate voltage. In RRAM, the high or low resistance state may be determined by the direction of current flow.

BRIEF DESCRIPTION OF THE DRAWINGS

The following will be apparent from elements of the figures, which are provided for illustrative purposes and are not necessarily to scale.

DETAILED DESCRIPTION

This description of certain exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

Conventional MRAM write techniques have used a fixed-length word line pulse so that a voltage is applied to the MTJ for a constant duration during each write. The constant pulse duration is traditionally selected by considering a worst-case write scenario (e.g., consider the weakest bit in the memory), with the result that overall write speed is degraded. In contrast, with various embodiments of the present disclosure, improved MRAM write performance is achieved by using feedback from the memory cell that is being written, to determine when to end the write operation. By providing adaptive timing that can end the write operation after a variable length of time based on the state of the cell that is being written, faster writes may be achieved. By shortening the length of a write, power may also be conserved, e.g., due to decreased time for asserting a word line signal, and bit cell endurance may be improved.

Figure 1A:
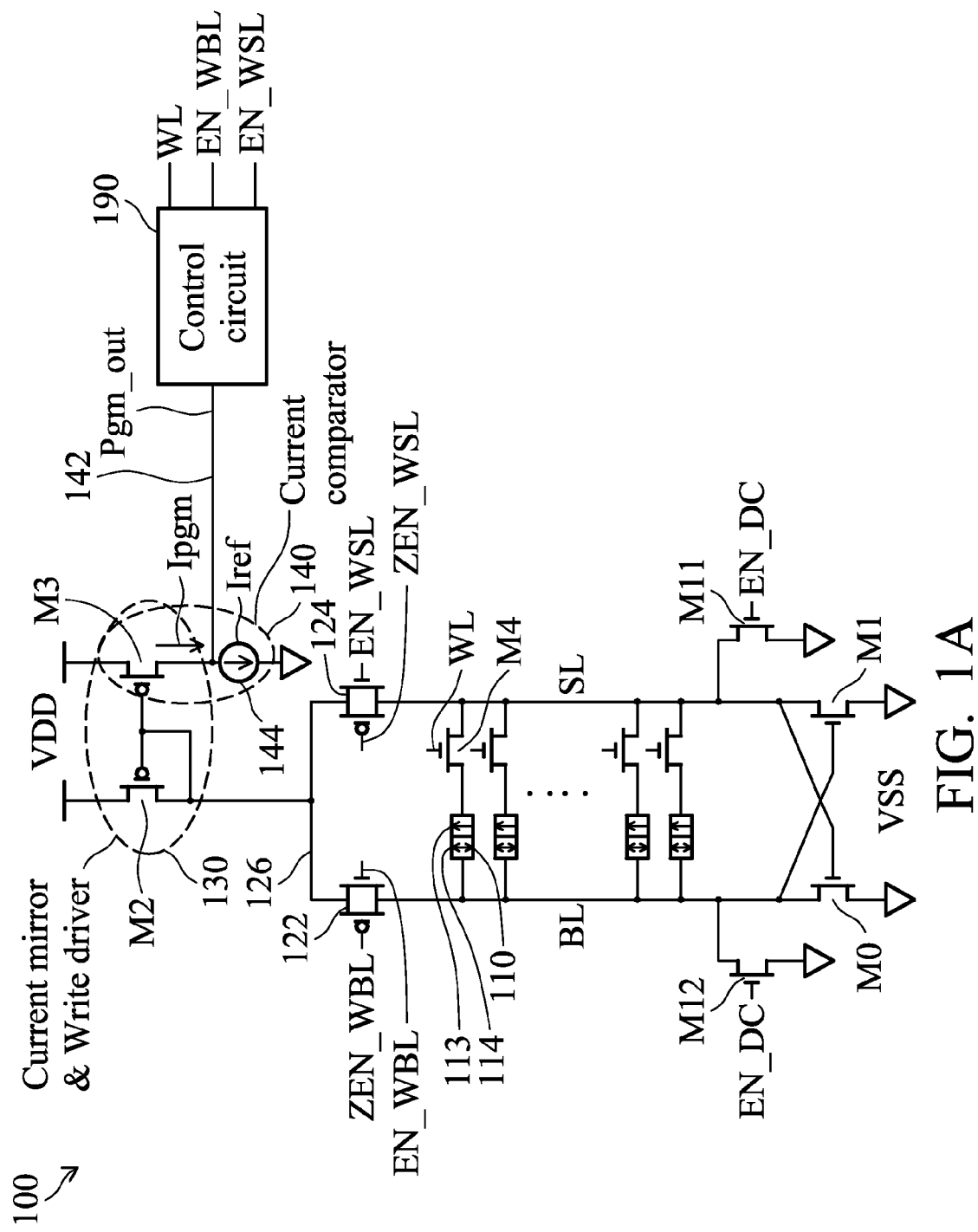
FIG. 1A is a schematic diagram of a circuit for improved MRAM write performance in accordance with some embodiments of the present disclosure.

FIG. 1A is a schematic diagram of a circuit for improved memory write performance in accordance with some embodiments of the present disclosure. An MRAM 100 includes one or more magneto-resistive cells 110. Although an MRAM is shown in this example, a similar configuration can be used in other embodiments with other types of memory cells, such as RRAM. In the MRAM example of FIG. 1A, each cell 110 includes a magnetic tunnel junction ("MTJ" or "MTJ element") having a pinned magnetic layer 113 and a free magnetic layer 114 that may be aligned parallel or antiparallel relative to one another. The parallel alignment corresponds to a low resistance state of the MTJ, and the antiparallel alignment corresponds to a high resistance state. Thus, the MTJ is a resistive element that has two different states that may be represented by logical bit values. As used herein, writing a low or high resistance state may also refer to writing a logical bit value corresponding to such a state.

A bit line BL and a source line SL (sometimes referred to as write bit line and write source line, respectively) are used to provide a voltage across the MTJ. When an access transistor M4 of cell 110 is turned on by asserting a word line signal WL at the gate of the transistor M4, the MTJ is coupled to SL. Depending on the relative voltages of BL and SL, a bias voltage of one polarity or another polarity may be applied across the MTJ. Circuit 100 includes a node 126 that is selectively coupled to BL and SL by CMOS pass gates (transmission gates) 122 and 124, respectively, which are switching units receiving inputs as shown in FIG. 1A. When an enable bit line signal EN_WBL is asserted, node 126 is coupled to BL; when an enable source line signal EN_WSL is asserted, node 126 is coupled to SL. Circuit 100 also includes a discharge path, which may be implemented with NMOS transistors M12 and M11 controlled by a signal EN_DC as shown in FIG. 1A, and a pair of pull-down transistors M0, M1 that are controlled by SL and BL, respectively. A discharge path similar to the one shown in FIG. 1A may also be used in the circuits of FIGS. 2A, 3, and 4.

A current mirror/write driver circuit 130 (hereinafter "current mirror 130" for short) and a current comparator 140 enable the state of cell 110 (while it is still being written to) to be used as the basis for determining when to end a write operation. When a bias voltage is applied across the MTJ as described above, a current flows through the MTJ (this current is sometimes referred to as a "bias current"), and the magnitude of the bias current depends on the resistance of the MTJ and the applied bias voltage in accordance with Ohm's Law. Memory cell 110 stores one of two possible states: a high resistance state corresponding to a relatively high resistance $R_H$ of the MTJ, and a low resistance state corresponding to a relatively low resistance $R_L$. The current flowing through the MTJ in the high resistance state is lower than the corresponding current in the low resistance state.

During a write operation, while the MTJ is transitioning from the high resistance state to the low resistance state (or vice-versa), the bias current (which is increasing or decreasing, depending on which state transition is underway) may be sensed and used to determine when to end the write. Current mirror 130 generates a mirror current (or "mirrored current") $I_{pgm}$ based on the bias current. $I_{pgm}$ is compared to a reference current $I_{ref}$ provided by a current source 144, to yield a comparison signal Pgm_out at a mirror node 142. The specific value of the reference current $I_{ref}$, as well as other reference currents $I_{ref\_1}$ and $I_{ref\_2}$ described further below, can be tuned (e.g., using a trimmable resistor $R_{TRIM}$ as shown in FIG. 1C) based on measurements of the bias current in the low and high resistance states and will be between those measurements in the low and high resistance states. Pgm_out serves as a stop signal that provides feedback for turning off WL and EN_WSL (in the case of a write operation that writes the high resistance state to cell 110) or for turning off WL and EN_WBL (in the case of a write operation that writes the low resistance state to cell 110), thereby causing the write operation to end.

Figure 1B:
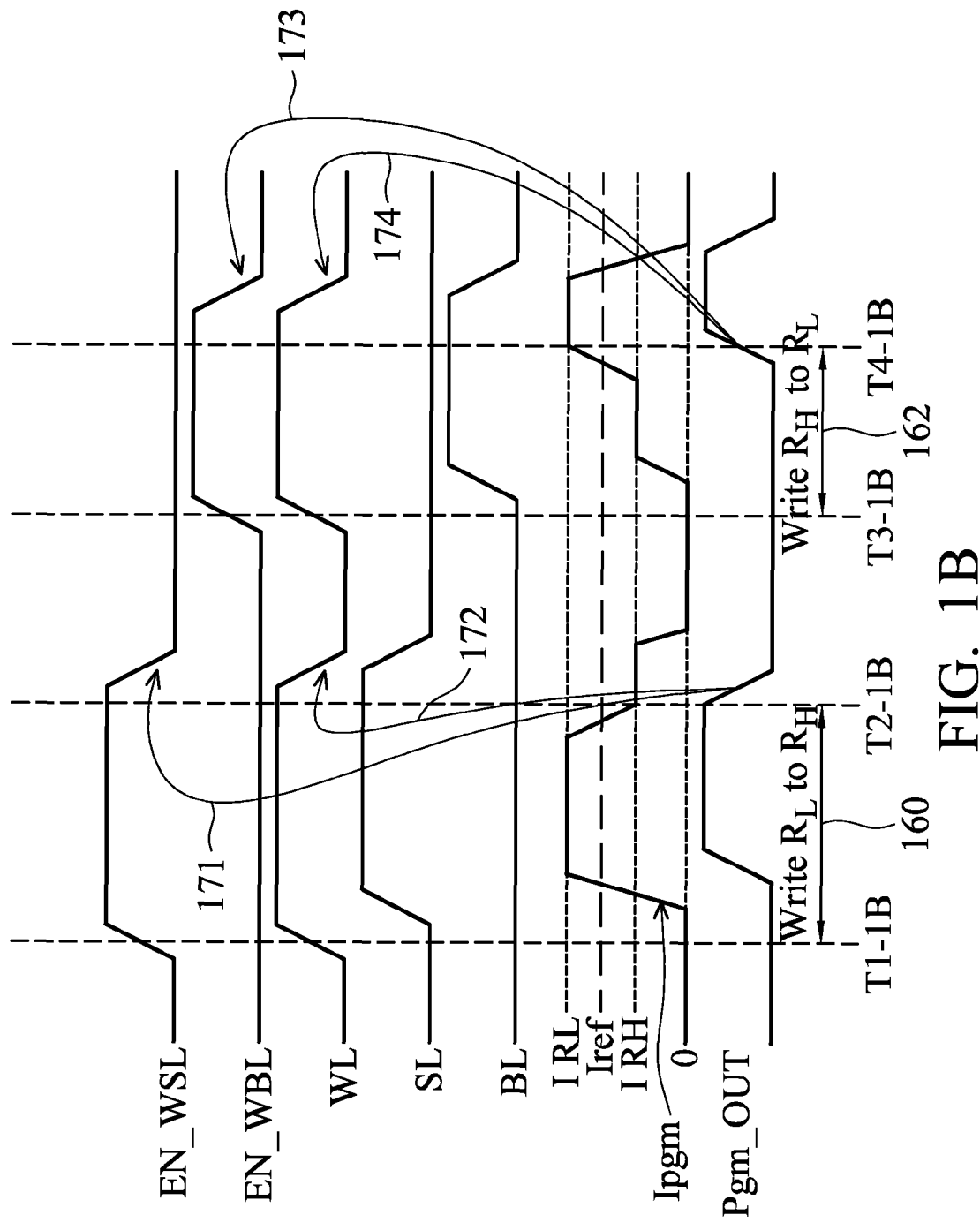
FIG. 1B is a timing diagram for various signals shown in FIG. 1A.
Figure 1C:
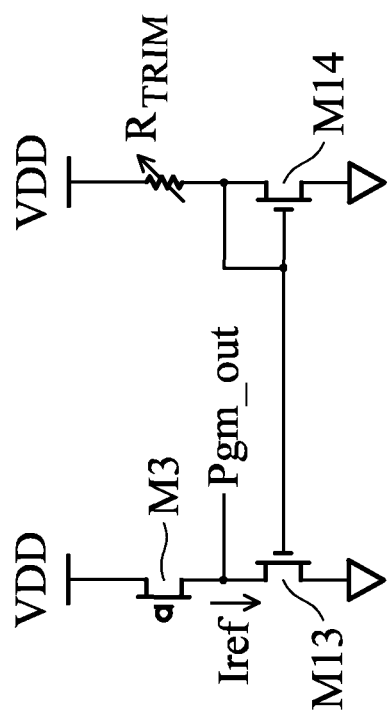
FIG. 1C is a schematic diagram of a circuit including a trimmable resistor in accordance with some embodiments.

FIG. 1B is a timing diagram for various signals shown in FIG. 1A. Initially, the MTJ is in the low resistance state. Because EN_WSL and EN_WBL are both initially low (before time T1-1B), pass gates 122 and 124 are both off. Because current mirror 130 is not coupled to memory cell 110, $I_{pgm}$ is initially low. At time T1-1B, WL is rising to start a write operation for writing the high resistance state into memory cell 110. Because BL is low, NMOS transistor M1 is off. EN_WSL rises, which turns on pass gate 124 and charges SL.

When SL is high and WL has turned on transistor M4, a bias voltage is provided across the MTJ, because BL is low. As the write operation progresses (moving towards the right in time interval 160 in FIG. 1B), the resistance of the MTJ increases, so the bias current through the MTJ decreases. The bias current, which is conducted by the turned-on pass gate 124 (FIG. 1A), is provided at node 126 which is coupled to the gate of PMOS transistor M3, so mirror current $I_{pgm}$ is generated and rises. As the bias current decreases, transistor M2 will turn on, causing node 126 to charge to ($V_{DD}$-$V_{tp}$), where $V_{tp}$ is the threshold voltage of transistor M2.

Referring again to FIG. 1B, when $I_{pgm}$ reaches a predetermined reference current $I_{ref}$, further rise in $I_{pgm}$ causes Pgm_out to rise. Thus, Pgm_out is a comparison signal that is high when $I_{pgm}$>$I_{ref}$. Later in the interval 160, $I_{pgm}$ starts to fall as the high resistance state is successfully written to cell 110. At time T2-1B, When $I_{pgm}$ (which is falling) reaches $I_{ref}$, Pgm_out starts to fall. Pgm_out is provided to control circuitry 190 for controlling EN_WSL and WL, so EN_WSL and WL fall based on Pgm_out falling, as shown by arrows 171 and 172. One of ordinary skill in the art will understand that control circuitry 190, which causes EN_WSL and WL to fall based on Pgm_out falling, and which causes EN_WBL and WL to fall based on Pgm_out rising, may be implemented in various ways. Setting WL low in this manner ends the write operation. Thus, rather than asserting WL for a fixed duration as in prior approaches, embodiments of the present disclosure provide a feedback timing control for deasserting WL based on a mirror current, which is itself based on the resistance of the MTJ during the write operation (i.e., based on the state of the data storage element before the write operation is completed).

A write operation for writing the low resistance state is also shown in FIG. 1B. At time T3-1B, EN_WBL is rising, which causes BL to charge as shown, and WL is rising, which initiates the write operation that occurs in interval 162. When EN_WBL is high, pass gate 122 is on. With BL high and SL low, a bias voltage is provided across the MTJ, with the opposite polarity compared to the case of writing the high resistance state.

$I_{pgm}$ rises during interval 162 as the low resistance state is successfully written to cell 110, and when $I_{pgm}$ reaches $I_{ref}$, the comparison signal Pgm_out rises. EN_WBL and WL fall based on Pgm_out rising, as shown by arrows 173 and 174. Thus, the interval 162 corresponding to the write operation ends after a variable amount of time (not a fixed amount of time as in prior techniques), based on the feedback signal Pgm_out, which is itself based on the resistance of the MTJ during the write operation. As shown in FIG. 1B, the duration of a write operation for writing a high resistance state to cell 110 may be different than the duration of a write operation for writing a low resistance state.

Figure 2A:
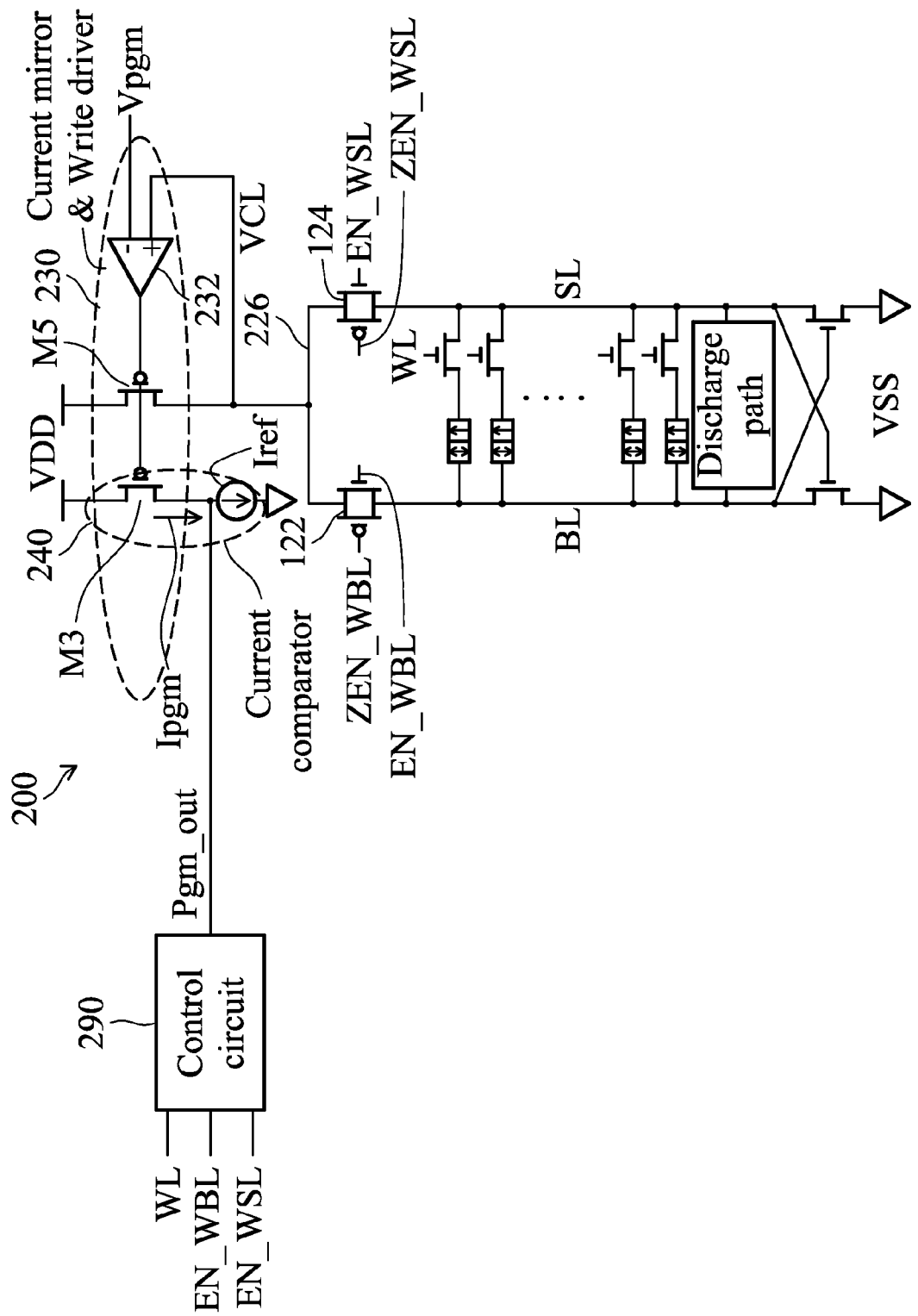
FIG. 2A is a schematic diagram of another circuit, using a voltage clamp, for improved MRAM write performance in accordance with some embodiments.

FIG. 2A is a schematic diagram of another circuit for improved MRAM write performance in accordance with some embodiments. Circuit 200 is similar in several respects to circuit 100 of FIG. 1A, so only differences between the two circuits are discussed in detail herein. Like circuit 100, circuit 200 includes a current mirror circuit 230 and a current comparator 240, and the current mirror circuit is selectively coupled to memory cells by pass gates that are coupled to node 226. Current mirror 230 includes an amplifier 232 having a non-inverting terminal coupled 226, and an inverting terminal coupled to a programmable voltage Vpgm. An output of amplifier 232 is coupled to the gates of respective PMOS transistors M3 and M5. Transistor M5 has a source coupled to a positive power supply voltage VDD and a drain coupled to node 226, so amplifier 232 functions to clamp the voltage VCL at node 226 at Vpgm, as described further below for FIG. 2B. A control circuit 290, which causes EN_WSL and WL to fall based on Pgm_out rising, and which causes EN_WBL and WL to fall based on Pgm_out falling, may be implemented in various ways.

Figure 2B:
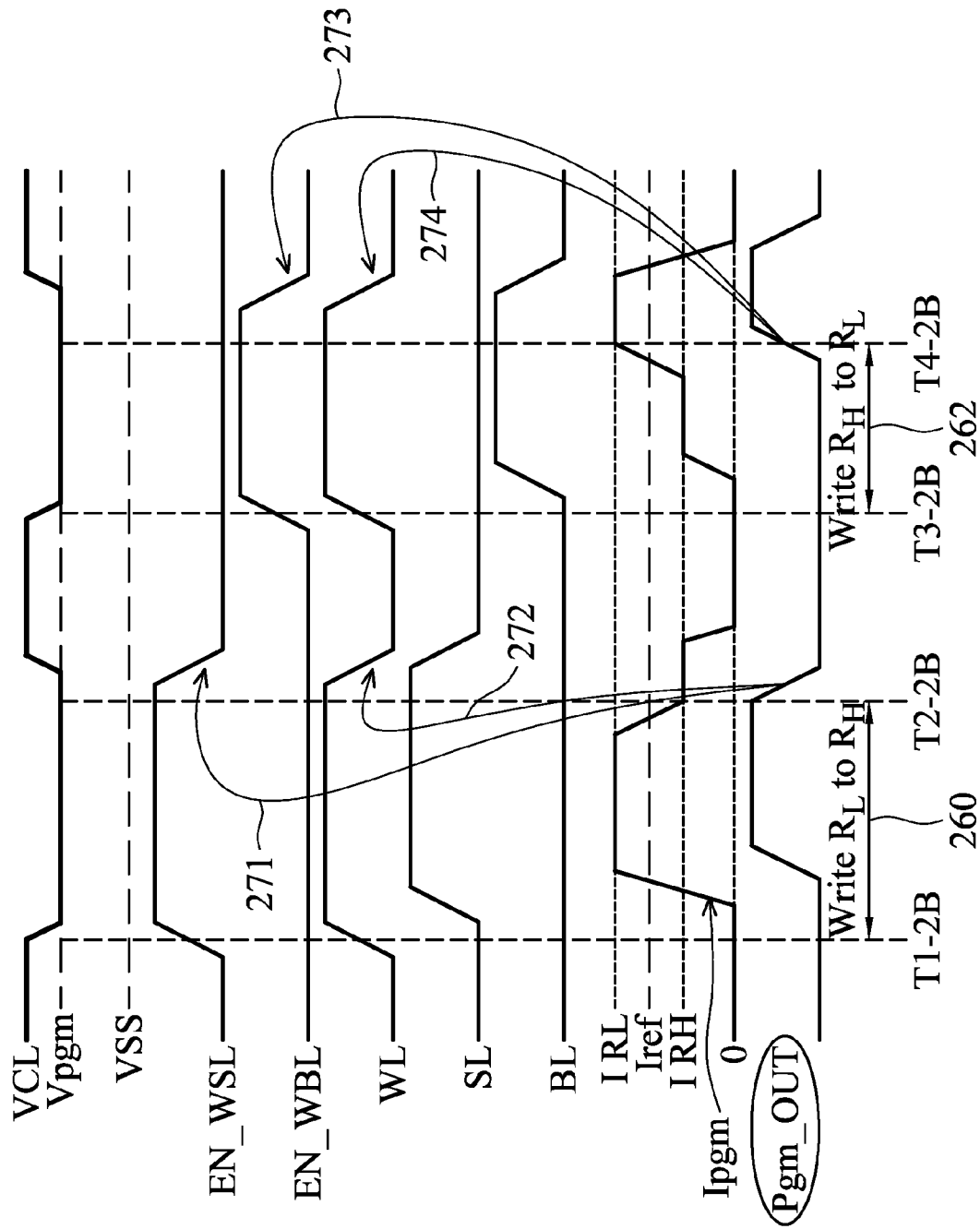
FIG. 2B is a timing diagram for various signals shown in FIG. 2A.

FIG. 2B is a timing diagram for various signals shown in FIG. 2A. Initially (before time T1-2B), the MTJ is in the low resistance state, and high resistance is written during interval 260 (similar to interval 160 of FIG. 1B), and low resistance is written during interval 262 (similar to interval 162). Many aspects of FIG. 2B are similar to FIG. 1B and do not require further description; only differences are discussed herein. EN_WSL and EN_WBL are both low initially, so pass gates 122 and 124 are both off. Initially, pass gates 122 and 124 are both off and thus VCL is charged to be higher than Vpgm. When EN_WSL rises to turn on pass gate 124, an electrical path to the relatively lower voltage SL is provided, so VCL falls. When VCL reaches Vpgm, the output of amplifier 232 causes M5 to turn on, maintaining (clamping) VCL at Vpgm. The output of amplifier 232 also drives PMOS transistor M3 to generate mirror current $I_{pgm}$, which is compared with $I_{ref}$ to generate comparison signal Pgm_out in a manner similar to the discussion above regarding FIGS. 1A-1B. The fall in Pgm_OUT at time T2-2B causes EN_WSL and EN_WL to fall, as shown by arrows 271 and 272, respectively.

VCL charges after time T2-2B because pass gate 122 is off at time T2-2B (due to EN_WBL being low) and pass gate also is off when EN_WSL becomes low. Thus, VCL is charged until VCL>Vpgm.

The voltage clamp functions in a similar manner during a write operation that writes the low resistance state into memory cell 110 (interval 262), and the rise in Pgm_out at time T4-2B causes EN_WBL and WL to fall, as shown by arrows 273 and 274, respectively.

Figure 3:
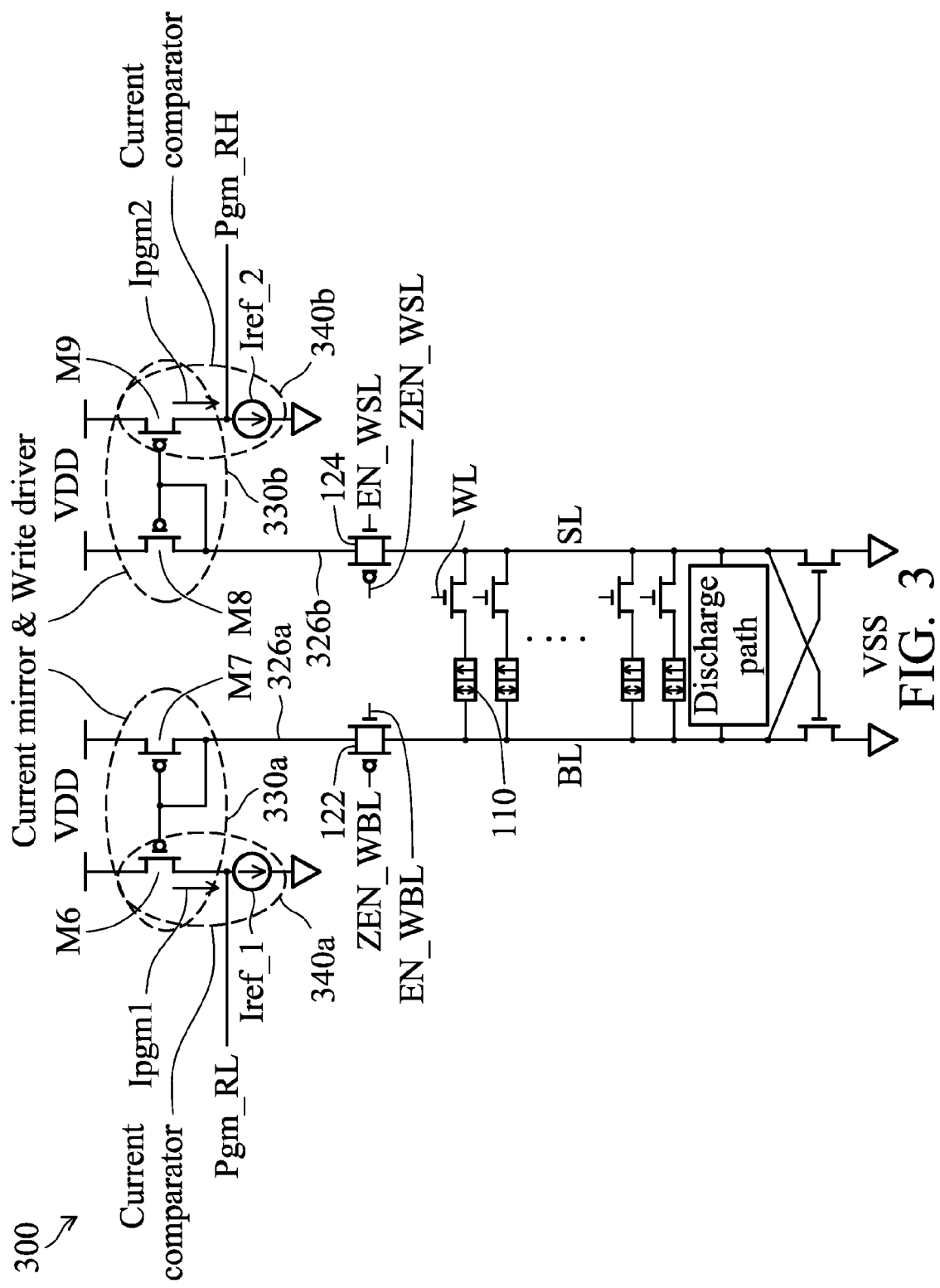
FIG. 3 is a schematic diagram of an alternate implementation of the circuit of FIG. 1A, with separate current mirrors and current comparators for writing the low resistance state and the high resistance state, respectively.

FIG. 3 is a schematic diagram of an alternate implementation of the circuit of FIG. 1A, with separate (split) current mirrors and current comparators for writing the low resistance state and the high resistance state, respectively. In circuit 300, current mirror 330a and node 326a are selectively coupled to memory cell 110 by pass gate 122, and current mirror 330b and node 326b are selectively coupled to memory cell 110 by pass gate 124 via a transistor driven by WL as shown in FIG. 3. Current mirror 330a, including transistors M6 and M7, provides mirror current $I_{pgm1}$ at the drain of M6 when pass gate 122 is on, which occurs during a write operation that writes the low resistance state to cell 110. Comparator 340a provides a comparison signal Pgm_RL based on comparison between mirror current $I_{pgm1}$ and reference current $I_{ref\_1}$. A fall in Pgm_RL causes EN_WBL and WL to fall, ending the write operation.

Current mirror 330b, including transistors M8 and M9, provides mirror current $I_{pgm2}$ at the drain of M9 when pass gate 124 is on, which occurs during a write operation that writes the high resistance state to cell 110. Comparator 340b provides a comparison signal Pgm_RH based on comparison between mirror current $I_{pgm2}$ and reference current $I_{ref\_2}$. A rise in Pgm_RH causes EN_WSL and WL to fall, ending the write operation.

Figure 4:
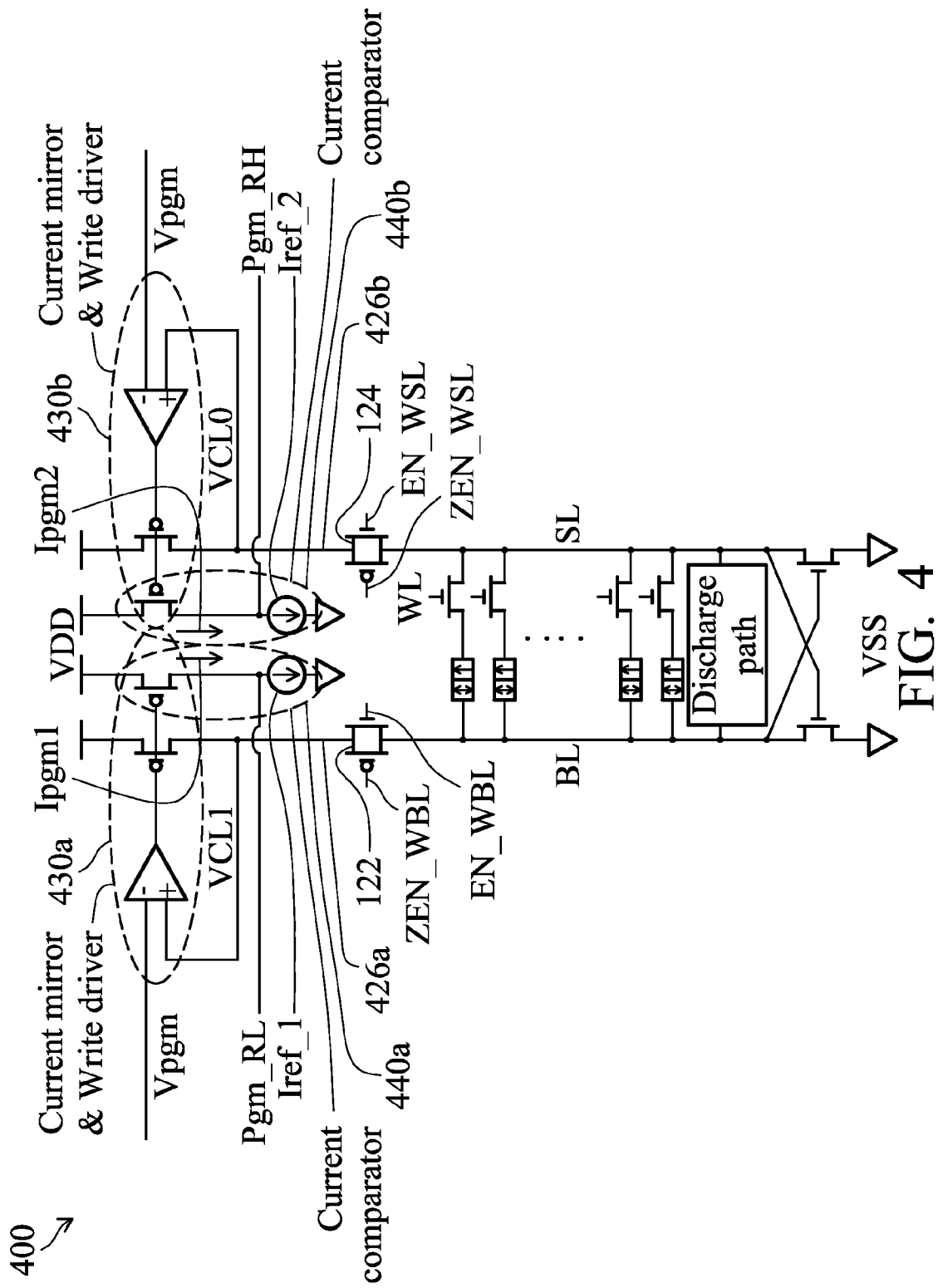
FIG. 4 is a schematic diagram of an alternate implementation of the circuit of FIG. 2A, with separate current mirrors and current comparators for writing the low resistance state and the high resistance state, respectively.

FIG. 4 is a schematic diagram of an alternate implementation of the circuit of FIG. 2A, with separate (split) current mirrors and current comparators for writing the low resistance state and the high resistance state, respectively. In circuit 400, current mirror 430a and node 426a are selectively coupled to memory cell 110 by pass gate 122, and current mirror 430b and node 426b are selectively coupled to memory cell 110 by pass gate 124 via a transistor driven by WL as shown in FIG. 4. Current mirror 430a provides mirror current $I_{pgm1}$ when pass gate 122 is on, which occurs during a write operation that writes the low resistance state to cell 110. Comparator 440a provides comparison signal Pgm_RL based on comparison between mirror current $I_{pgm1}$ and reference current $I_{ref\_1}$. A fall in Pgm_RL causes EN_WBL and WL to fall, ending the write operation.

Current mirror 430b provides mirror current $I_{pgm2}$ when pass gate 124 is on, which occurs during a write operation that writes the high resistance state to cell 110. Comparator 440b provides comparison signal Pgm_RH based on comparison between mirror current $I_{pgm2}$ and reference current $I_{ref\_2}$. A rise in Pgm_RH causes EN_WSL and WL to fall, ending the write operation.

In circuits 300 and 400, by using split current mirrors and current comparators for the respective "write high resistance" and "write low resistance" cases, logic circuitry for controlling WL, EN_WSL, and EN_WBL is simpler than corresponding logic circuitry of respective circuits 100 and 200. The resulting savings in area, cost, and power consumption for the control circuitry may more than offset the doubling of the current mirrors and current comparators themselves.

Figure 5:
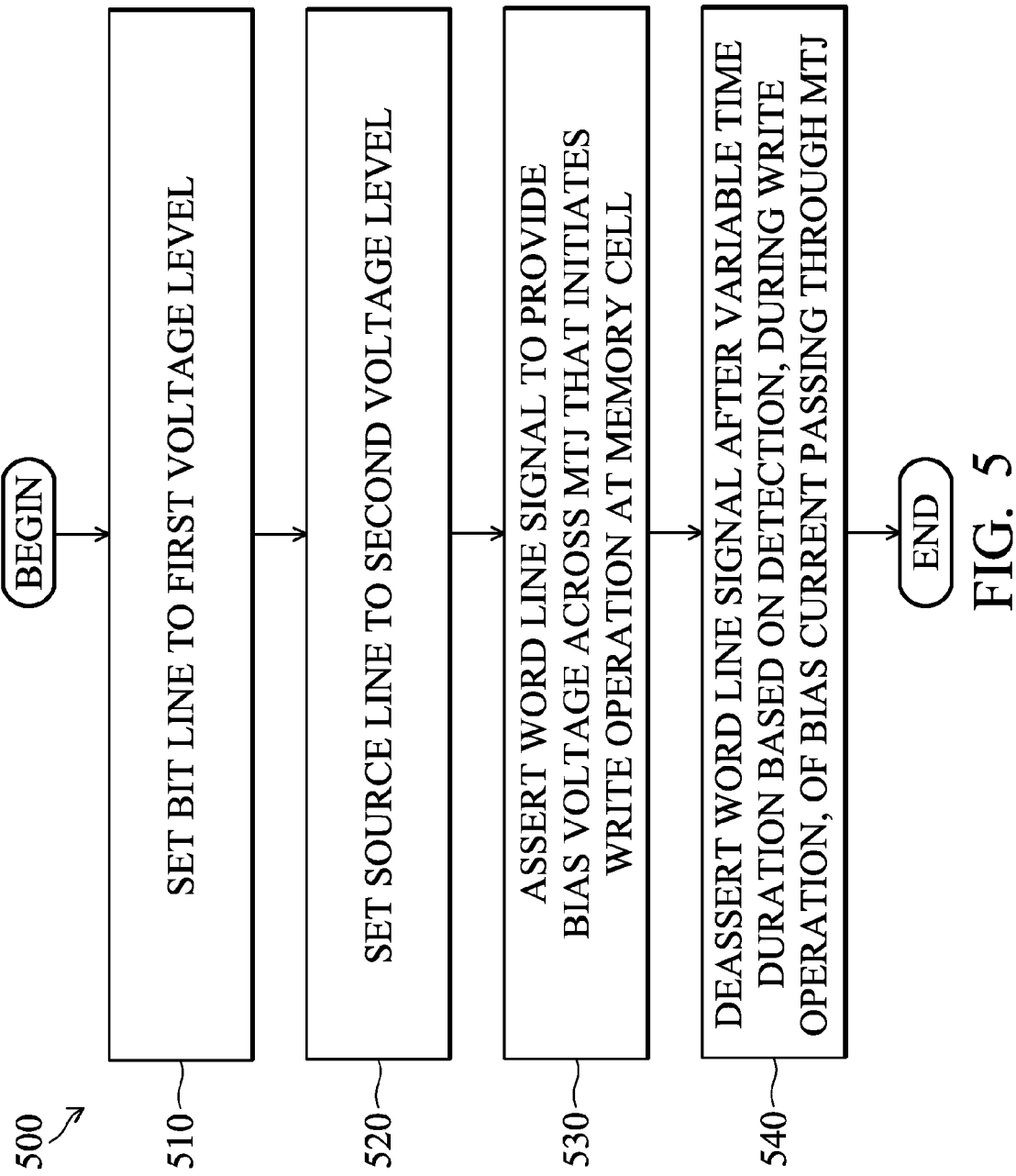
FIG. 5 is a flow diagram of a process in accordance with some embodiments.

FIG. 5 is a flow diagram of a process in accordance with some embodiments. After process 500 begins, a bit line (e.g., BL in FIG. 1A), which is coupled to a resistive element of a memory cell (e.g., cell 110), is set (block 510) to a first voltage level. The resistive element is configured to have a first resistance in a first state of the memory cell and a second resistance in a second state of the memory cell. A source line (e.g., SL in FIG. 1A), which is selectively coupled to the memory cell by an access transistor, is set (block 520) to a second voltage level. A word line signal (e.g., WL in FIG. 1A) is asserted (block 530) to apply a first bias voltage across the resistive element. The applied first bias voltage initiates a write operation at the memory cell. The word line signal is deasserted (block 540) after a variable time duration based on a detection, during the write operation, of a current through the resistive element.

Figure 6:
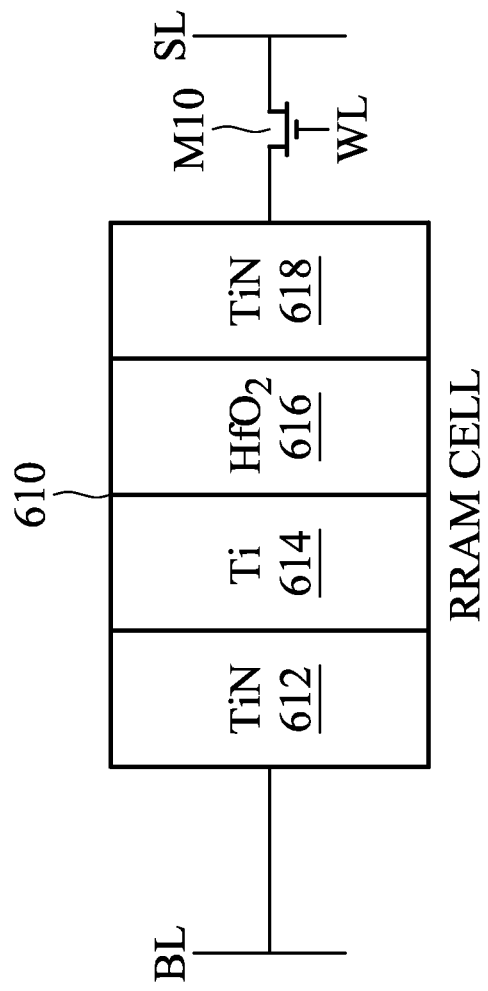
FIG. 6 is a diagram of an RRAM cell in accordance with some embodiments.

FIG. 6 is a diagram of an RRAM cell in accordance with some embodiments. An RRAM cell 610 comprising layers 612, 614, 616, 618 corresponding to TiN, Ti, Hf2 and TiN, respectively may be coupled to a bit line BL and may be selectively coupled to a supply line SL via a transistor M10 (e.g., NMOS transistor) that has a gate coupled to a word line WL. The high or low resistance state of cell 610 may be determined by the direction of current flow. RRAM cell 610 and transistor M10 may be used in FIG. 1A in place of MRAM cell 110 and transistor M4.

In some embodiments, a digital memory apparatus (e.g., memory 100) includes a memory cell (e.g., cell 110, which may be an MRAM cell or a RRAM cell), a bit line (e.g., BL in FIG. 1A), a source line (e.g., SL in FIG. 1A), an access transistor (e.g., transistor M4), a current mirror circuit (e.g., circuit 130), a current comparator (e.g., current comparator 140), and a control circuit (e.g., circuit 190). The memory cell includes a resistive element configured to have a first resistance in a first state of the memory cell and a second resistance in a second state of the memory cell. The bit line is coupled to the resistive element. The access transistor is coupled between the resistive element and the source line. The current mirror circuit is selectively coupled to the memory cell. The current mirror circuit is configured to mirror a bias current, corresponding to a voltage of a first polarity applied across the resistive element, to provide a mirrored current. The current comparator is configured to compare the first mirrored current against a first reference current, to provide a comparison signal (e.g., Pgm_out). The control circuit is configured to control a gate of the access transistor based on the comparison signal.

In some embodiments, a digital memory apparatus (e.g., memory 100) includes a memory cell (e.g., cell 110, which may be an MRAM cell or a RRAM cell), an access transistor (e.g., transistor M4), first and second pull-down transistors (e.g., transistors M0 and M1, respectively), first and second switching units (e.g., pass gates 122 and 124, respectively), a current mirror circuit (e.g., circuit 130), a current comparator (e.g., current comparator 140), and a control circuit (e.g., circuit 190). The memory cell includes a magnetic tunnel junction resistive element configured to have a first resistance in a first state of the memory cell and a second resistance in a second state of the memory cell. The access transistor is coupled between a bit line and a source line (e.g., BL and SL, respectively, in FIG. 1A). The first pull-down transistor has a gate coupled to the source line, and the second pull-down transistor has a gate coupled to the bit line. The first and second switching units are coupled to the bit line and source line, respectively. The current mirror circuit is coupled to at least one of the switching units, and is configured to mirror a bias current from the memory cell to provide a mirrored current. The current comparator is configured to compare the mirrored current against a reference current, to provide a comparison signal. The control circuit is configured to control, based on the comparison signal, a gate of the access transistor, the first switching unit, and the second switching unit.

In some embodiments, a bit line (e.g., BL in FIG. 1A), which is coupled to a resistive element of a memory cell (e.g., cell 110, which may be an MRAM cell or an RRAM cell), is set to a first voltage level. The resistive element is configured to have a first resistance in a first state of the memory cell and a second resistance in a second state of the memory cell. A source line (e.g., SL in FIG. 1A), which is selectively coupled to the memory cell by an access transistor, is set to a second voltage level. A word line signal is asserted (e.g., WL in FIG. 1A) to apply a first bias voltage across the resistive element. The applied first bias voltage initiates a write operation at the memory cell. The word line signal is deasserted after a variable time duration based on a detection, during the write operation, of a current through the resistive element.

Although examples are illustrated and described herein, embodiments are nevertheless not limited to the details shown, since various modifications and structural changes may be made therein by those of ordinary skill within the scope and range of equivalents of the claims.

What is claimed is:

1. A method comprising:
   setting a bit line, coupled to a resistive element of a memory cell, to a first voltage level, wherein the resistive element is configured to have a first resistance in a first state of the memory cell and a second resistance in a second state of the memory cell;
   setting a source line to a second voltage level, wherein the source line is selectively coupled to the memory cell by an access transistor;
   asserting a word line signal to apply a first bias voltage across the resistive element, wherein the applied first bias voltage initiates a first write operation at the memory cell; and
   deasserting the word line signal after a variable time duration based on a detection, during said first write operation, of a current through the resistive element.

2. The method of claim 1, further comprising:
   mirroring the current to provide a mirrored current flowing into a mirror node; and
   comparing the mirrored current to a reference current to provide a comparison signal at the mirror node;
   wherein said deasserting the word line signal is based on the comparison signal.

3. The method of claim 2, further comprising:
   based on the comparison signal, deasserting a source line enable signal to turn off a first transistor having a terminal coupled to the source line.

4. The method of claim 2, further comprising:
   based on the comparison signal, deasserting a bit line enable signal to turn off a first transistor having a terminal coupled to the bit line.

5. The method of claim 1, wherein the first voltage level is lower than the second voltage level, and the first write operation writes to the memory cell a logical bit value associated with a high resistance state of the resistive element.

6. The method of claim 5, further comprising:
   mirroring the current using a first current mirror circuit switchably coupled to the source line to provide a mirrored current to a mirror node, wherein the first current mirror circuit is different than a second current mirror circuit that is provided for use during a second write operation associated with setting the resistive element to a low resistance state; and
   comparing the mirrored current to a reference current to provide a comparison signal at the mirror node;
   wherein deasserting the word line signal is based on the comparison signal.

7. The method of claim 1, wherein the first voltage level is higher than the second voltage level, and the first write operation writes to the memory cell a logical bit value associated with a low resistance state of the resistive element.

8. The method of claim 7, further comprising:
   mirroring the current using a first current mirror circuit switchably coupled to the bit line to provide a mirrored current to a mirror node, wherein the first current mirror circuit is different than a second current mirror circuit that is provided for use during a second write operation associated with setting the resistive element to a high resistance state; and
   comparing the mirrored current to a reference current to provide a comparison signal at the mirror node;
   wherein deasserting the word line signal is based on the comparison signal.

9. The method of claim 1, further comprising:
   setting the bit line to the second voltage level;
   setting the source line to the first voltage level;
   asserting the word line signal to provide a second bias voltage, having a polarity opposite to a polarity of the first bias voltage, across the resistive element to initiate a second write operation at the memory cell; and
   deasserting the word line signal based on detection, during said second write operation, of the current through the resistive element to decouple the source line from the resistive element.

10. The method of claim 9, wherein a time interval between assertion and deassertion of the word line signal for the first write operation is different than a time interval between assertion and deassertion of the word line signal for the second write operation.

11. A digital memory apparatus comprising:
a memory cell comprising a resistive element configured to have a first resistance in a first state of the memory cell and a second resistance in a second state of the memory cell;
a bit line coupled to the resistive element;
a source line;
an access transistor coupled between the resistive element and the source line;
a first current mirror circuit selectively coupled to the memory cell, the first current mirror circuit configured to mirror a first bias current, corresponding to a voltage of a first polarity applied across the resistive element, to provide a first mirrored current;
a first current comparator configured to compare the first mirrored current against a first reference current, to provide a first comparison signal that depends on a relationship between the first mirrored current and the first reference current; and
a control circuit configured to control a gate of the access transistor based on the first comparison signal.

12. The digital memory apparatus of claim 11, wherein the memory cell is an MRAM memory cell, and the resistive element is a magnetic tunnel junction of the MRAM memory cell.

13. The digital memory apparatus of claim 11, wherein the memory cell is an RRAM memory cell.

14. The digital memory apparatus of claim 11, further comprising:
a switching unit configured to selectively couple the first current mirror circuit to the bit line based on a bit line enable signal;
wherein the control circuit is further configured to control the bit line enable signal based on the first comparison signal.

15. The digital memory apparatus of claim 11, further comprising:
a switching unit configured to selectively couple the first current mirror circuit to the source line based on a source line enable signal;
wherein the control circuit is further configured to control the source line enable signal based on the first comparison signal.

16. The digital memory apparatus of claim 11, further comprising:
a first switching unit configured to selectively couple the bit line to a first node; and
a second switching unit configured to selectively couple the source line to the first node;
wherein the first current mirror circuit includes:
a first PMOS transistor having a source coupled to a positive power supply, a drain coupled to the first node, and a gate coupled to the first node; and
a second PMOS transistor having a source coupled to the positive power supply, a gate coupled to the first node, and a drain, wherein the first current mirror circuit is configured to provide the first mirrored current at the drain of the second PMOS transistor.

17. The digital memory apparatus of claim 11, further comprising:
a first switching unit configured to selectively couple the bit line to a first node; and
a second switching unit configured to selectively couple the source line to the first node;
wherein the first current mirror circuit includes:
an amplifier having a noninverting terminal coupled to the first node, an inverting terminal coupled to a programmable voltage, and an output;
a first PMOS transistor having a gate coupled to the output of the amplifier, a source coupled to a positive power supply, and a drain coupled to the first node; and
a second PMOS transistor having a gate coupled to the output of the amplifier, a source coupled to the positive power supply, and a drain, wherein the first current mirror circuit is configured to provide the first mirrored current at the drain of the second PMOS transistor.

18. The digital memory apparatus of claim 11, further comprising:
a first switching unit configured to selectively couple the first current mirror circuit to the memory cell;
a second switching unit;
a second current mirror circuit selectively coupled, by the second switching unit, to the memory cell, the second current mirror circuit configured to mirror a second bias current, corresponding to a voltage of a second polarity applied across the MTJ element, to provide a second mirror current; and
a second current comparator configured to compare the second mirror current against a second reference current, to provide a second comparison signal.

19. A digital memory apparatus comprising:
a memory cell including a resistive element configured to have a first resistance in a first state of the memory cell and a second resistance in a second state of the memory cell;
an access transistor coupled between a bit line and a source line;
a first pull-down transistor having a gate coupled to the source line;
a second pull-down transistor having a gate coupled to the bit line;
a first switching unit coupled to the bit line;
a second switching unit coupled to the source line;
a current mirror circuit coupled to at least one of the switching units, the current mirror circuit configured to mirror a bias current from the memory cell to provide a mirrored current;
a current comparator configured to compare the mirrored current against a reference current, to provide a comparison signal; and
a control circuit configured to control, based on the comparison signal, a gate of the access transistor, the first switching unit, and the second switching unit.

20. The digital memory apparatus of claim 19, wherein the memory cell is an MRAM memory cell, and the resistive element is a magnetic tunnel junction of the MRAM memory cell.

21. The digital memory apparatus of claim 19, wherein the memory cell is an RRAM memory cell.

* * * * *